United States Patent [19]

Babu et al.

[11] Patent Number: 5,248,973
[45] Date of Patent: Sep. 28, 1993

[54] HIGH-SPEED, HIGH-RESOLUTION ANALOG TO DIGITAL CONVERTER SUBRANGING ARCHITECTURE

[75] Inventors: B. N. Suresh Babu, Chelmsford; Herbert B. Wollman, Burlington, both of Mass.

[73] Assignee: The Mitre Corporation, Bedford, Mass.

[21] Appl. No.: 782,832

[22] Filed: Oct. 24, 1991

[51] Int. Cl.⁵ .................... H03M 1/14; H03M 1/08
[52] U.S. Cl. .................................. 341/156; 341/122; 341/118
[58] Field of Search ............ 341/156, 122, 118, 155, 341/145

[56] References Cited
U.S. PATENT DOCUMENTS

| | | | |
|---|---|---|---|
| 4,612,533 | 9/1986 | Evans | 341/156 X |
| 4,733,217 | 3/1988 | Dingwall | 341/122 |
| 4,862,171 | 8/1989 | Evans | 341/156 |
| 4,893,124 | 1/1990 | Tsuji et al. | 341/156 |
| 4,973,974 | 11/1990 | Suzuki | 341/156 X |
| 5,072,220 | 12/1991 | Petschacher et al. | 341/156 |

*Primary Examiner*—Sharon D. Logan
*Attorney, Agent, or Firm*—Choate, Hall & Stewart

[57] ABSTRACT

A very high-speed, high-resolution, low-noise, subranging analog-to-digital (AJD) converter architecture is described. It employs several sample-and-hold circuits in parallel. Also, the second-stage fine quantization flash A/D converter circuit of the conventional subranging A/D converter is replaced with a hybrid subranging converter of higher resolution and linearity. This is shown to achieve a very high dynamic range by minimizing noise due to the sample-and-hold and fine quantization circuits. This architecture permits construction of 16 to 18 bit 10 MHz A/D converters applicable for airborne radar systems.

10 Claims, 2 Drawing Sheets

HIGH-SPEED, HIGH-RESOLUTION ANALOG TO DIGITAL CONVERTER SUBRANGING ARCHITECTURE

BACKGROUND OF THE INVENTION

The detection of radar signals in strong and varying clutter requires signal processing capabilities with the combination of high speed and a very wide dynamic range. The dynamic range is determined by the system noise level with which the signal is quantized. The analog-to-digital (A/D) converter is a critical part of the signal processing apparatus and is crucial to the achievement of linear dynamic response required for clutter cancellation. The current state-of-the-art high-speed high-resolution analog to digital converter suitable for airborne radar application is 14 bits at a 5 MHz sampling rate. The architecture of a conventional, prior art subranging A/D converter is shown schematically in FIG. 1 for an N-bit converter.

In this scheme, as shown in the figure, a conversion is performed in two successive stages with three functional blocks and two converter blocks. The input signal is sampled and held constant by a sample-and-hold (S/H) circuit. The output of the sample-and-hold circuit is applied to both a flash encoder, ADC1, in converter stage 1, and a subtraction circuit in converter stage 2. The output of the first flash encoder is then fed to a digital-to-analog (D/A) converter to obtain an initial approximation of the input signal, which is also applied to the subtraction circuit. The subtraction circuit in converter stage 2, which is formed from amplifier AMP3 and several resistors, produces an error signal derived by subtracting the approximated signal from the original sample signal. The amplified error signal is then applied to a second flash encoder, ADC2, in converter stage 2. The outputs of the first and second encoders are combined by a digital error correction unit to determine the final N-bit word. The amplifier AMP1 shown in FIG. 1 is the input buffer which usually has unity gain and it isolates the input from the rest of the circuit. During the sample mode, the switch is closed and capacitor C charges up to the input signal voltage. When the converter enters the hold mode, the switch opens, and the capacitor voltage maintains a constant value. Output buffer amplifier AMP2 provides a duplicate of the voltage on the hold capacitor. It should have a very high input impedance to avoid loading the capacitor. The entire circuit from AMP1 to AMP2 is referred to as the sample-and-hold (S/H) circuit. In the analysis to follow we assume that this switch is a diode bridge since this is what is used in most S/H circuits.

Stage 1: The flash converter, ADC1, makes a coarse digitization of the signal to a resolution of M bits. The digital word from ADC1 is applied to a very fast reconstruction digital to analog converter that produces an output current equal to and of opposite sign from the current flowing through resistor R2. The resolution M of ADC1 is one bit more than half of N, the total A/D converter resolution.

Stage 2: The error amplifier, AMP3, is an operational amplifier with feedback that holds the amplifier input near ground potential, so the current in R2 is proportional to the sample and hold output. The difference between the R2 current and the digital to analog converter output current represents the error in the stage 1 measurement. This difference current flows through resistor R3. A second A/D converter, ADC2, measures this error voltage. The two A/D converters must have a total resolution of at least one or two bits greater than the final system in order to allow error correction. The error correction circuit prevents the noise and errors of ADC1 from appearing in the final output; however, ADC2 will contribute noise.

Thirty-five percent of the total internal noise for the currently available 14-bit 5 MHz A/D converter comes from the S/H and fifty-one percent comes from ADC2. Current A/D converters are also limited by the technology to ten bits as the number of bits used for the first and second flash stages. It is therefore desirable to increase the accuracy of the second converter stage without increasing the resolution of a flash converter. An architecture for A/D conversion that overcomes the limitations of the current state-of-the-art must decrease the noise due to the S/H and fine quantization circuit while maintaining high digital word resolution.

SUMMARY OF INVENTION

This invention relates to an architecture for A/D conversion that achieves a very high dynamic range by minimizing the noise due to the S/H and fine quantization circuits.

The A/D converter architecture uses several sample and hold circuits in parallel and drives the error amplifier with the average of the sample and hold outputs; and replaces the fine quantization circuit of conventional converter architectures with a hybrid subranging converter of higher resolution, which produces an overall A/D converter with three stages of conversion.

Since the noise sources are uncorrelated, the sample and hold circuits of the invention reduces the noise power constituted by the sample and hold by a factor that is equal to the number of parallel sample and hold circuits.

Because the design effort is essentially that for a two-stage converter, the subranging circuit of the invention achieves a three-stage conversion process for the same design effort as that involving a two-stage process.

PREFERRED EMBODIMENTS

Figure 1:
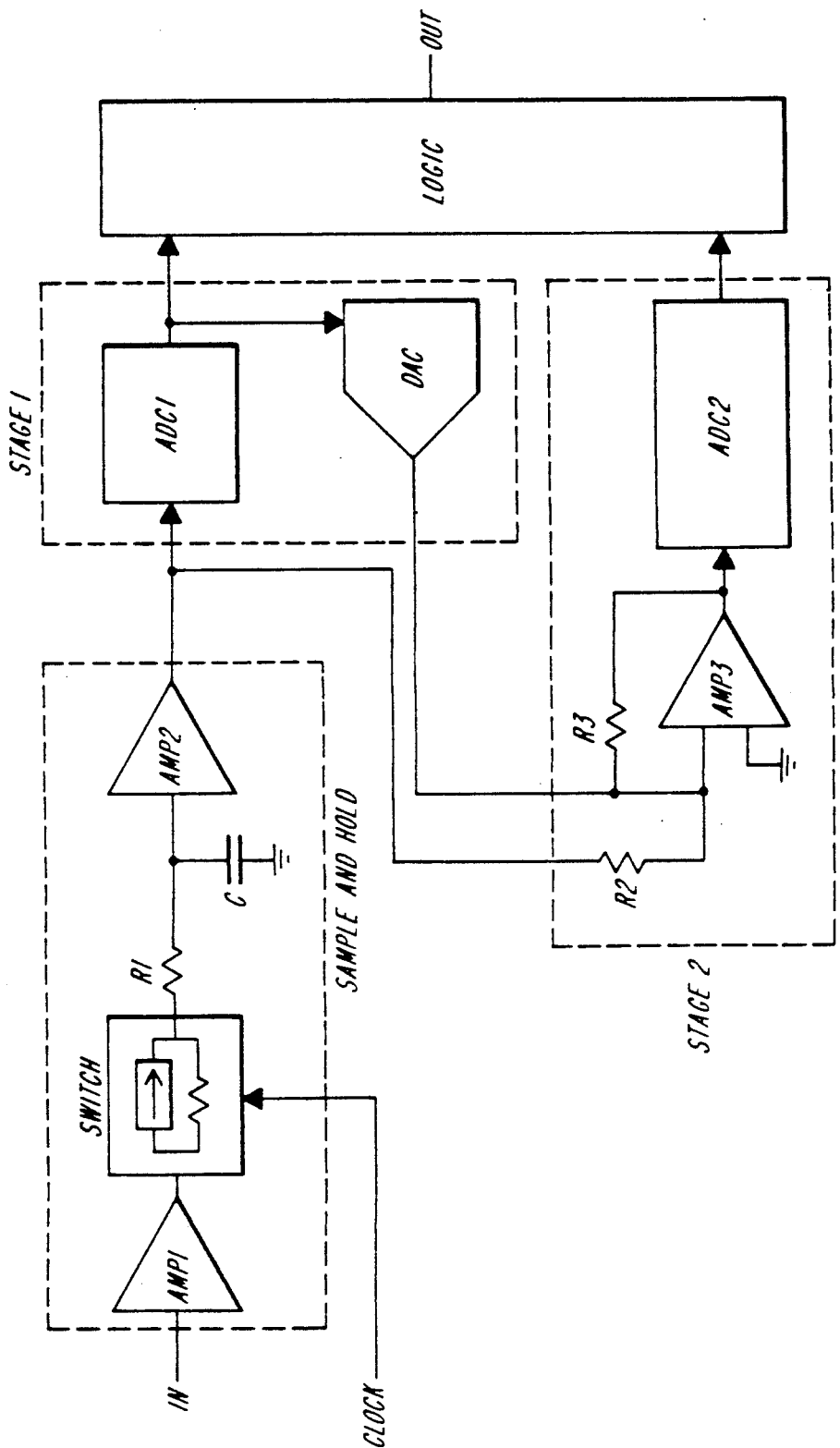
FIG. 1 is a block diagram of a prior art two-stage A/D conversion architecture.

We begin by presenting the theory of internal noise for A/D conversion units.

Almost 90 percent of the total internal noise for the currently available A/D converters is from the sample and hold (S/H) circuit and the fine quantization circuit. The architecture presented here reduces the S/H noise by using several S/H circuits in parallel, and reduces the fine quantizer noise by replacing the fine quantization circuit with a subranging converter architecture. with a resistor capacitor circuit, and an output buffer amplifier. The noise contributed by each amplifier is calculated as the product of the noise density of the amplifier and the noise equivalent bandwidth of that amplifier. A spreadsheet calculation of the noise contributed by the input amplifier ($N_{IB}$) and the output amplifier ($N_{OB}$) uses $$N_{IB}^2 J_{IB}^2 BW_{IB} \tag{1}$$

$$N_{OB}^2 = J_{OB}^2 BW_{OB} \tag{2}$$

where

- $N_{IB}$, $N_{OB}$ = noise contributed by the input and output amplifiers (volts)
- $J_{IB}$, $J_{OB}$ = noise voltage densities of the input and output amplifiers in volt/$\sqrt{\text{Hz}}$
- $BW_{IB}$, $BW_{OB}$ = bandwidth of the input and output amplifiers (Hz)

We use a typical value of 1.4 nanovolt/Hz for the noise density based on current technology for high-speed, high-impedance amplifiers. The equivalent noise bandwidth is dependent on the sampling frequency, the number of bits of the A/D converter, and the acquisition time of the S/H. The acquisition duty cycle is the percentage of the time between samples that is allocated by the designer for settling of the S/H. The remainder of the inter-sample period is allocated to stages 1 and 2 of the A/D converter. We have determined, based on the spreadsheet calculation mentioned above, that 33 percent of the time allocated for the sample and hold S/H typically yields the best signal-to-noise ratio and is used as a default value in the spreadsheet model. The noise bandwidth is computed from equations (1) and (2).

$$\text{noise bandwidth} = \frac{1}{\sqrt{8\pi \, \tau_a}} \text{ (Hz)} \tag{3}$$

$$\tau_a = \frac{\eta_a}{\{[N+1]\ln(2)\}F_s} \text{ (seconds)} \tag{4}$$

where

- $\eta_a$ = acquisition duty cycle = 0.33
- N = number of bits of the converter
- $F_s$ = sampling frequency (Hz)

The circuit designer chooses the value of the resistor and capacitor to allow the circuit to settle to an accuracy of one-half of one least significant bit (LSB). Note that the resistor includes the amplifier output impedance and the resistance of the bridge. The capacitor is chosen to be as large as possible to meet the time constant requirements.

$$C \leq \frac{\tau_a}{R} \tag{5}$$

where

- C = capacitance (farads)
- R = total resistance (ohms)
- $\tau_a$ is defined in equation (4)

The switch in the S/H can be one or more bipolar or field effect transistors, or it can be a diode bridge, as used in the best current designs. In the sample mode, all of the switch elements mentioned above are equivalent to a small resistor, both in dynamic characteristics and noise. The resistor noise is computed from $$N_R^2 = 4K \, T \, R \, BW_{IB} \tag{6}$$

where
- $N_R$ = resistor noise (volts)
- K = Boltzmann's Constant (watts/(Hz)(° K.))
- T = temperature (Kelvin)
- R = resistance (ohms)
- $BW_{IB}$ = bandwidth of the input buffer (Hz)

When the switch opens to produce the hold mode, a small charge is emitted which changes the voltage on capacitor C. The mean change in capacitor voltage, called "the pedestal," produces a dc offset which is corrected elsewhere in the system. The sample-to-sample variation in this charge causes a variation in the output voltage, making it an additional noise source.

In the spreadsheet we use a value of 1600 attocoulombs root mean square (RMS) charge variation (QSW) based on current technology. The noise voltage (NSW) is given by $$N_{SW} = \frac{Q_{SW}}{C} \tag{7}$$

where

- $Q_{SW}$ = RMS charge variation (coulombs) and
- C = capacitance (farads).

The switching noise is a significant contributor to the total noise, but there are ongoing industry efforts to reduce it.

In a sampled data system, an analog voltage is sampled at a fixed sampling rate. If the actual instant of sampling differs from the ideal, uniformly-spaced instant by a small delay, $\Delta t$, the sampled voltage will be in error by an amount $\Delta V$, which is the product of $\Delta t$ and the rate of change of voltage, dv/dt. If we assume that $\Delta t$ and dv/dt are independent Gaussian random variables with zero mean, then the mean square noise voltage caused by the sampling jitter is $$E[\Delta V^2] = E[\Delta t^2] E\left[\left[\frac{dv}{dt}\right]^2\right], \text{ where } E[\cdot] \text{ denotes expectation.} \tag{8}$$

The RMS value of the error is the square root of the expression in equation (8). If the signal being sampled is a sine wave of frequency f and RMS value V, then we have $$\text{RMS jitter error} = 2\pi f \, V \, \Delta t \text{ (volts)} \tag{9}$$

However, in a radar system, inphase and quadrature signals which are digitized by the A/D converter each will have a Gaussian distribution. The aperture jitter noise depends on the signal-plus-noise voltage, the receiver bandwidth, and the transmitted waveform. For a radar system in which the return is dominated by clutter, the RMS voltage change (dv/dt) is approximately the ratio of the RMS clutter voltage to the compressed pulsewidth (PW). The noise caused by aperture jitter (Nj) is $$N_J = \Delta T \frac{dv}{dt} = \Delta T \frac{V_{CL}}{PW} \text{ (volts)} \tag{10}$$

where
- $\Delta T$ = RMS aperture jitter (seconds)
- $V_{CL}$ = RMS clutter voltage (volts)
- PW = compressed pulsewidth assumed to be equal to $2/F_S$ (seconds)
- FS =サンsampling frequency (Hz)

In calculating the RMS clutter voltage, the criteria we use in our calculation is that the clutter voltage should not exceed the A/D converter dynamic range more than 0.1 percent of the time. A standard reference table describing the Gaussian distribution shows the 99.9 percent of the area is within ±3.3 sigma points of the distribution. Hence, the RMS clutter voltage is given by $$V_{CL} = \frac{FSR}{6.6} \text{ (volts)} \quad (11)$$

Substituting equation (11) into equation (10) results in $$N_J = \frac{FSR \Delta T}{6.6 \, PW} \text{ (volts)} \quad (12)$$

The aperture jitter for an A/D converter is specified to be very small so that the aperture jitter noise will be much smaller than the sum of the other internal noise sources of the A/D converter. Since this noise is small, it will not impact the clutter cancellation of the radar.

The total noise voltage contributed by the S/H is the root sum square of the noise components from the buffer and amplifiers, the switch, the resistors, and the jitter.

$$N_{S/H} = \sqrt{N_{IB}^2 + N_{OB}^2 + N_R^2 + N_{SW}^2 + N_J^2} \text{ volts} \quad (13)$$

The S/H circuit is a relatively small portion of the total converter from the size, power, or cost standpoint, but it contributes a disproportionately large share of the total noise. Below we discuss possible ways to reduce the noise contributed by that source.

As discussed earlier, stage 1 of the A/D converter consists of a flash A/D converter (ADCL) and the DAC. Any noise or errors of ADC1 will be corrected by the second stage using digital error correction logic. The noise contributed to the total noise in stage 1 is from the DAC.

The DAC is modeled as a set of switched current sources, plus a nonswitched current source equal to half of its full-scale range, and of opposite polarity, to provide bipolar output. The current sources are based on resistors, and a fixed reference voltage DACV. The noise contributed by the DAC is given by $$N_{DAC}^2 = \frac{FSR^2}{DACV I_{DAC}} (4KTBW) S_1 \quad (14)$$

where
$N_{DAC}$ = DAC noise (volts)
FSR = A/D converter full-scale input voltage (volts)
DACV = DAC reference voltage, typically five volts
$I_{DAC}$ = DAC full-scale current (amperes)
K = Boltzmann's Constant (watts/(Hz)(° K.))
T = temperature (Kelvin)
BW = bandwidth of the error amplifier (Hz)
$S_1$ = constant dependent on DAC architecture, typically about 1.8

Note that the DAC full-scale current is limited by the maximum output current that the S/H can generate without distortion. Below, we consider S/H architectures which allow $I_{DAC}$ to be increased to improve the performance of high-speed A/D converters. The DAC's speed is an important parameter because it must finally settle to N-bits before the second-stage A/D converter makes it conversion. The error amplifier will be saturated until the DAC has settled to the resolution of ADC1.

Stage 2 of conversion is comprised of an error amplifier, denoted as AMP3, ADC2, and the error correction logic.

The error amplifier is a high-gain, high-speed operational amplifier. The noise it contributes is given by $$N_{err}^2 = \frac{J_{err}^2 BW_{err}(G + 1)^2}{G^2} \quad (15)$$

where
$N_{err}$ = error amplifier noise (volts)
$J_{err}$ = noise voltage density of the error amplifier in volt/$\sqrt{Hz}$
$BW_{err}$ = bandwidth of the error amplifier (Hz)
G = effective gain of the error amplifier The bandwidth of the error amplifier must be sufficient to allow it to settle to at least one-half LSB of ADC2. The time available for it to settle is given by $$T_{settle} = \left(\frac{1 - \eta_a}{F_s}\right) - T_{DAC} \text{ (seconds)} \quad (16)$$

The bandwidth of the error amplifier is computed from $$BW_{err} = \frac{1}{(\sqrt{8\pi} \, T_{settle})(N_2 + 1)\ln(2)} \text{ (Hz)} \quad (17)$$

where
$N_2$ = number of bits of ADC2

The spreadsheet mentioned above also is useful to include the noise associated with resistors R2 and R3 given by $$N_{R2}^2 = 4 \, KT \, R2 \, BW_{err} \quad (18a)$$

$$N_{R3}^2 = \frac{N_{R2}}{G_1} \quad (18b)$$

where
$N_{R2}$ = noise from resistor $R_2$ (volts)
$N_{R3}$ = noise from resistor $R_3$ (volts)
$G_1$ = amplifier gain Any noise or nonlinearity in the second converter, ADC2, will contribute to the output. If the noise is measured in units of LSBS, it adds directly to other noise sources; however, if it is expressed in units of volts, it must be referred to the input by dividing by the error amplifier gain. Below we discuss different architectures that can be used to reduce its noise. Since the error correction circuits at the output of an A/D converter are digital, they do not contribute to the system noise. The total noise voltage of stage 2 is the root sum square of its components.

$$N_{stage2} = \sqrt{N_{err}^2 + N_{R2}^2 + N_{R3}^2 + N_{ADC2}^2} \quad (19)$$

where
$N_{err}$ = noise of the error amplifier (volts)
$N_{R2}$ = resistor noise (volts)
$N_{R3}$ = resistor noise (volts)
$N_{ADC2}$ = noise of ADC2 (volts)

The total noise voltage is the root sum square of the S/H noise, the DAC noise, and the stage 2 noise.

$$N_{TOTAL} = \sqrt{N_{S/H}^2 + N_{DAC}^2 + N_{STAGE2}^2 + N_Q^2} \quad (20)$$

where
$N_Q^2$ = quantization noise = $Q^2/12$ $$Q = LSB \text{ of the converter} = \frac{\text{full-scale voltage range}}{2^N}$$

N = number of bits of the converter

Since 35 percent of the total internal noise for the 14-bit, 5 MHz A/D converter is from the sample and hold (S/H) and 51 percent is from the ADC2, we must reduce the noise from the SIH and ADC2, as well as quantization to improve the performance significantly.

Figure 2:
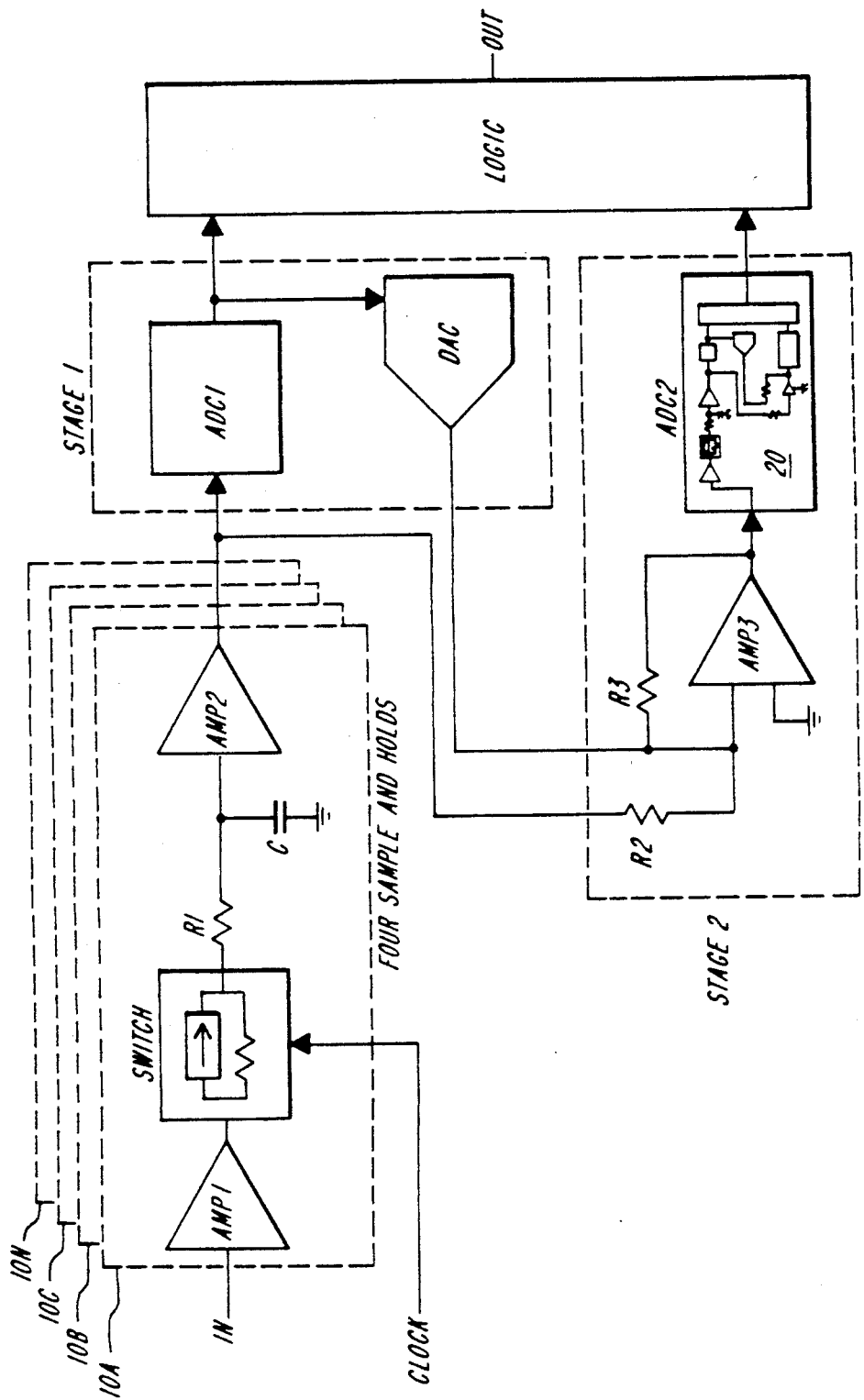
FIG. 2 is a block diagram of the A/D conversion architecture of the invention.

Referring to FIG 2, one possible method of reducing S/H noise is to employ several S/H circuits 10A-10N in parallel and drive the error amplifier with the average of the S/H outputs. Since all of the noise sources are uncorrelated, the noise power of the average is reduced by a factor that is nearly equal to the number of S/H circuits.

One possible way to reduce the noise from ADC2 is to replace it with a hybrid or monolithic subranging converter 20 with two stages of conversion, resulting in a total of three conversion stages. Using the architecture improvements discussed in this section we will show through noise analysis that, as technology matures, a low-noise 16 bit, 10 MHz A/D converter would be feasible for airborne radar application.

It is possible to achieve a signal-to-noise ratio (SNR) of 95 dB for future airborne radar systems using either a 16-bit converter of extremely low internal noise, or a 17- to 18-bit converter with a relaxed specification on its internal noise. However, based on current technology, the most promising approach is to employ four parallel S/H circuits 10 to reduce the S/H noise and replace the ADC2 with a 14-bit hybrid subranging A/D converter 20, such as the Analog Devices model, AD 9060. The computer noise model described above can be used to analyze the three-stage conversion architecture by combining the last two stages. For example, if stage 1 of the A/D converter is based on a current 6-bit flash DAC, and stage 2 is based on a 14-bit hybrid A/D converter, we have a total of 20 bits. The digital error correction logic will require two bits of overlap to correct the errors and noise of ADCL. This results in 18 bits of output resolution. The computer noise model predicts that the internal noise of this converter would be comparable to that of a 16-bit converter.

To illustrate the effect of architecture changes on the noise performance, we make four modifications to the baseline 14-bit, 5 MHz design parameters and then parametrically analyze them using the spreadsheet calculations. First, the input full-scale range is increased from 2.5 to 4.0 volts which causes fixed noise voltage sources to be a smaller percentage of the full-scale range. Second, all amplifier bandwidths are increased sufficiently to allow settling to 16 bits in the same time as the conventional design which settles to 14 bits. This small increase in bandwidth (about 14 percent) tends to increase the noise. Third, there are four parallel S/H circuits, each similar to the baseline design. Fourth, the second ADC is an AD 9060 subranging 14-bit A/D converter hybrid assembly, which has about 0.8 LSBs of combined noise and nonlinearity. Table I shows the noise analysis spreadsheet for the modified architecture. Table II shows the dominant noise sources for both the conventional converter and the improved converter of the invention. The improved design is tabulated for a 16-bit and an 18-bit resolution. In each case, the bandwidth of the amplifiers is only sufficient to settle to approidmately 16-bit accuracy. Table 1 indicates that with currently available components, it is possible to produce a 5 MHz A/D converter with 16-bit resolution and an SNR of 93.5 dB. It should also be possible to achieve an SN-R of 95 dB by increasing the resolution to 18 bits, thereby reducing the quantization noise.

Tables I and II show that the largest single noise source for this architecture is the error amplifier in converter stage 2. This noise depends only on the noise density and bandwidth of the error amplifier. The bandwidth should thus be increased in order to accommodate the increased sampling rate. Allocating a smaller percentage of the total time to the S/H to acquisition will also slightly improve the SN-R. Table I shows a projected SNR of 93.9 dB at 16-bit resolution, and an SNR of 95.8 at 18-bit resolution.

TABLE I

Effect of Architectural Changes on Dominant Noise Sources

| Dominant Noise Sources | 16-Bit A/D Converter | | | 18-Bit A/D Converter | | |
|---|---|---|---|---|---|---|
| | picoVolt$^2$ | LSBs | % | picoVolt$^2$ | LSBs | % |
| Quantization Noise | 310.44 | 0.29 | 54% | 19.41 | 0.29 | '3% |
| Total S/H Noise | 188.56 | 0.22 | 33% | 188.56 | 0.90 | 33% |
| DAC Noise | 36.56 | 0.10 | 6% | 36.56 | 0.40 | 6% |
| Error Amp & Resistor Noise | 205.07 | 0.23 | 35% | 205.07 | 0.94 | 35% |
| ADC2 Noise | 149.01 | 0.20 | 26% | 149.01 | 0.80 | 26% |
| Total Internal Noise | 579.19 | 0.39 | 100% | 579.19 | 1.58 | 100% |
| Total Noise | 889.63 | 0.49 | 154% | 598.60 | 1.60 | 103% |
| Full-Scale Range (Volts) | 4.00 | | | 4.00 | | |
| Signal-to-Noise Ratio (dB) | 93.52 | | | 95.24 | | |

TABLE II

Noise Analysis for the Proposed MITRE 16/18-Bit, 10 MHz A/D Converter Architecture

| Parameters | Units | Sym | Value | Change | Value | Change | Value |
|---|---|---|---|---|---|---|---|
| General | | | | | | | |
| Bits | | N | 14 | + 2 | 16 | + 4 | 18 |
| Sampling Rate | MHz | Fs | 5.00 | * 2.00 | 10.00 | * 2.00 | 10.00 |
| Full Scale Range | V | FSR | 2.50 | * 1.60 | 4.00 | * 1.60 | 4.00 |
| Quantum Size | uV | q | 152.59 | | 61.04 | | 15.26 |

TABLE II-continued
Noise Analysis for the Proposed MITRE 16/18-Bit, 10 MHz A/D Converter Architecture

| Parameters | Units | Sym | Value | Change | Value | Change | Value |
|---|---|---|---|---|---|---|---|
| Quantization Noise | pV2 | Nq | 1940.26 | | 310.44 | | 19.40 |
| Temperature | deg C. | Temp | 70.00 | | 70.00 | | 70.00 |
| Thermal Energy | aJ | k4T | 0.02 | | 0.02 | | 0.02 |
| Electron charge | aC | e | 0.16 | | 0.16 | | 0.16 |
| S/H | | | | | | | |
| Acquisition Duty Cycle | | Etaa | 0.33 | * 0.76 | 0.25 | * 0.76 | 0.25 |
| Acquisition Time | ns | Ta | 66.00 | | 25.00 | | 25.00 |
| Acquisition Time const | ns | taua | 6.35 | | 2.25 | 16 bit | 2.25 |
| Acquisition Noise BW | MHz | NBWa | 39.38 | | 110.90 | | 110.90 |
| In Buff Noise Dens | nV/rHz | JIB | 1.40 | * 0.75 | 1.05 | * 0.75 | 1.05 |
| In Buff Noise | pV2 | NIB | 77.19 | | 122.27 | | 122.27 |
| Switch Resistance | Ohm | RD | 20.00 | * 0.50 | 10.00 | * 0.50 | 10.00 |
| Series Resistor | Ohm | Rel | 50.00 | * 0.25 | 12.50 | * 0.25 | 12.50 |
| Total Resistance | Ohm | RSh | 70.00 | | 22.50 | | 22.50 |
| S/H Resistor Noise | pV2 | NRSh | 52.20 | | 47.25 | | 47.25 |
| Hold Capacitor | pF | CSh | 90.68 | | 100.19 | | 100.19 |
| Hold Transition Charge | aC | QNSh | 1600.00 | * 0.50 | 800.00 | * 0.50 | 800.00 |
| Pedestal noise sq | pV2 | NStoH | 311.30 | | 63.76 | | 63.76 |
| Out Buff Noise Dens | nV/rHz | JOB | 3.00 | * 0.75 | 2.25 | * 0.75 | 2.25 |
| Out Buff Noise | pV2 | NOB | 204.23 | | 228.09 | | 228.09 |
| RMS dV/dt | MV/s | dV/dt | 0.95 | | 3.03 | | 3.03 |
| Jitter | psec | Jit | 3.00 | * 1.00 | 3.00 | * 1.00 | 3.00 |
| Jitter Noise | pV2 | NJit | 8.07 | | 82.64 | | 82.64 |
| S/Hs per Converter | | NumSH | 1 | * 4 | 4 | * 4 | 4 |
| S/H Output Curent | A | SHIout | 0.02 | * 1.50 | 0.12 | * 1.50 | 0.12 |
| Total S/H Noise | pV2 | NSH | 652.99 | | 136.00 | | 136.00 |
| Stage1 | | | | | | | |
| Subrange Bits | | Nsub1 | 6 | + 0 | 6 | + 0 | 6 |
| ADC1 & DAC delay | ns | Tdelay | 50.00 | * 0.50 | 25.00 | * 0.50 | 25.00 |
| DAC Ref V | V | DACV | 5.00 | * 1.44 | 7.20 | * 1.44 | 7.20 |
| DAC Noise Dens sq | aA2/MHz | JINDAC2 | 136.32 | | 568.01 | | 568.01 |
| DAC Noise | pV2 | NDAC2 | 48.34 | | 28.43 | | 28.43 |
| Stage2 | | | | | | | |
| Subrange Bits | | Nsub2 | 10 | | 12 | | 14 |
| Amp settling time | ns | Tamp | 84.00 | | 50.00 | | 50.00 |
| Amp tau | ns | Tauamp | 11.02 | | 5.55 | 16 bit | 5.55 |
| Amp Noise Bandwidth | MHz | NBWamp | 22.69 | | 45.05 | | 45.05 |
| Amp Gain | | Gain | 16.00 | | 16.00 | | 16.00 |
| Amp Input resistor | Ohm | Re2 | 125.00 | | 33.33 | | 33.33 |
| R2 Noise Sq | pV2 | NRe2 | 53.71 | | 28.43 | | 28.43 |
| R3 Noise Sq | pV2 | NRe3 | 3.36 | | 1.78 | | 1.78 |
| Amp Noise Dens | nV/rHz | Jamp | 2.50 | * 0.75 | 1.88 | * 0.75 | 1.88 |
| Amp Noise | pV2 | Namp | 150.69 | | 168.29 | | 168.29 |
| ADC2 Noise RMS bits | q | ADC2LSBS | 0.20 | * 1.00 | 0.20 | * 4.00 | 0.80 |
| ADC2 Noise | pV2 | NADC2 | 931.32 | | 149.01 | | 149.01 |
| Total Stage2 Noise | pV2 | NStage2 | 1139.08 | | 347.52 | | 347.52 |
| Total | | | | | | | |
| Total Internal Noise | pV2 | NInt | 1840.40 | | 511.96 | | 511.96 |
| Int Noise RMS Quanta | | RMSQ | 0.28 | | 0.37 | | 1.48 |
| Total Noise | pV2 | NTot | 3780.66 | | 822.40 | | 531.36 |
| Noise Voltage | uV | NVolt | 61.49 | | 28.68 | | 23.05 |
| Signal to Noise Ratio | dB | SNR | 83.15 | | 93.86 | | 95.76 |

What is claimed is:

1. An analog to digital converting unit comprising:
   (a) an interface for accepting an analog signal,
   (b) a sample-and-bold (S/H) unit adapted to receive said analog signal, comprising more than 2 S/H circuits operating in parallel, each supplied with an analog voltage signal from said interface, and each producing a series of sampled voltage signals at specified time intervals,
   (c) a coarse analog to digital converting unit connected to said S/H circuits for providing coarse quantization of said samples voltage signal to produce a digital version of said voltage signals,
   (d) a digital to analog (D/A) converting unit connected to said coarse analog to digital converting unit for producing an error signal proportional to the difference between said samples voltage signals and said digital version of said voltage signals,
   (e) a subranging fine analog to digital converting unit connected to said digital to analog converting unit for quantizing the output of the digital to analog converting unit to produce a digital version of said error signal, said subranging analog to digital converting unit comprising:
      (1) and A/D converting unit providing coarse quantization of said error signal,
      (2) an A/D converting unit providing fine quantization of said error signal,
   (f) a logic interface connected to said subranging analog to digital converting unit adjusting said digital version of said voltage signals based on said digital version of said error signal to produce a digital output signal corresponding to said accepted analog signal.

2. An analog to digital converting unit comprising:
   (a) an interface for accepting an analog signal,
   (b) a sample-and-hold (S/H) unit adapted to receive said analog signal, comprising more than 2 S/H circuits operating in parallel, each supplied with an analog voltage signal from said interface, and each producing a series of sampled voltage signals at specified time intervals, (c) a coarse analog to digital converting unit connected to said S/H circuits for providing coarse quantization of said sampled voltage signals to produce a digital version of said voltage signals, (d) a digital to analog (D/A) converting unit connected to said coarse analog to digital converting unit for producing an error signal proportional to the difference between said sampled voltage signals and said digital version of said voltage signals, (e) a fine analog to digital converting unit connected to said digital to analog converting unit providing fine quantization of the output of the digital to analog converting unit to produce a digital version of said error signal, (f) a logic interface connected to said fine analog to digital converting unit for adjusting said digital version of said voltage signals base on said digital version of said error signal to produce a digital output signal corresponding to said accepted analog signal.

3. The analog to digital converting unit of claim 1 wherein said sample and hold unit comprises 4 parallel sample and hold circuits.

4. The analog to digital converting unit of claim 2 wherein said sample and hold unit comprises 4 parallel sample and hold circuits.

5. The analog to digital converting unit of claim 1, wherein said digital output signal comprises 14 bit resolution, and wherein said analog to digital converting unit operates at or above 5 MHz.

6. The analog to digital converting unit of claim 1, wherein said digital output signal comprises 16 bit resolution, and wherein said analog to digital converting unit operates at or above 10 MHz.

7. The analog to digital converting unit of claim 1, wherein said digital output signal comprises 18 bit resolution, and wherein said analog to digital converting unit operates at or above 10 MHz.

8. The analog to digital converting unit of claim 3, wherein said digital output signal comprises 14 bit resolution, and wherein said analog to digital converting unit operates at or above 5 MHz.

9. The analog to digital converting unit of claim 3, wherein said digital output signal comprises 16 bit resolution, and wherein said analog to digital converting unit operates at or above 10 MHz.

10. The analog to digital converting unit of claim 3, wherein said digital output signal comprises 18 bit resolution, and wherein said analog to digital converting unit operates at or above 10 MHz.

* * * * *

UNITED STATES PATENT AND TRADEMARK OFFICE
CERTIFICATE OF CORRECTION

PATENT NO. : 5,248,973

DATED : September 28, 1993

INVENTOR(S) : B.N. Suresh Babu and Herbert B. Wollman

It is certified that error appears in the above-indentified patent and that said Letters Patent is hereby corrected as shown below:

Column 2, line 58: before "with" please insert -- The S/H model consists of an input buffer amplifier, a switch --;

Column 2, line 65: delete existing equation (1) and insert therefor $$N^2_{IB} = J^2_{IB} BW_{IB}$$

Column 2, line 65: delete existing equation (2) and insert therefor $$N^2_{OB} = J^2_{OB} BW_{OB}$$

Column 3, line 58: delete existing equation (6) and insert therefor $$N^2_R = 4 K T R\; BW_{IB}$$

Column 5, line 20: delete existing equation (13) and insert therefor $$N_{S/H} = \sqrt{N^2_{IB} + N^2_{OB} + N^2_R + N^2_{SW} + N^2_J}\, volts$$

Column 5, line 30: delete "(ACDL) and insert therefor -- (ACD$\ell$) --;

Column 6, line 27: delete existing equation (17) and insert therefor $$BW_{err} = \frac{1}{(\sqrt{8\pi}\; T_{settle})(N^2 + 1)\ln(2)}\; (Hz)$$

UNITED STATES PATENT AND TRADEMARK OFFICE
CERTIFICATE OF CORRECTION

PATENT NO. : 5,248,973

DATED : September 28, 1993

INVENTOR(S) : B.N. Suresh Babu and Herbert B. Wollman

It is certified that error appears in the above-indentified patent and that said Letters Patent is hereby corrected as shown below:

Column 6, line 35: delete existing equation (18a) and insert therefor $$N^2{}_{R2} = 4\ KT\ R2\ BW_{err}$$

Column 7, line 18: delete "2" and insert therefor --1 --;

Column 8, line 30: delete "approidmately" and insert therefor --approximately--;

Column 8, line 34: delete "SN-R" and insert therefor -- SNR --;

Column 8, line 43: delete "SN-R" and insert therefor -- SNR --; and

Column 9, line 52: delete "sample-and-bold" and insert therefor --sample-and-hold--.

Signed and Sealed this

Fourth Day of October, 1994

Attest:

BRUCE LEHMAN

*Attesting Officer*    *Commissioner of Patents and Trademarks*